United States Patent [19]

Mote, Jr.

[11] Patent Number: 5,648,973
[45] Date of Patent: Jul. 15, 1997

[54] I/O TOGGLE TEST METHOD USING JTAG

[75] Inventor: L. Randall Mote, Jr., Laguna Hills, Calif.

[73] Assignee: AST Research, Inc., Irvine, Calif.

[21] Appl. No.: 596,043

[22] Filed: Feb. 6, 1996

[51] Int. Cl.$^6$ .................................................. G01R 31/28
[52] U.S. Cl. .................................................. 371/223; 371/27
[58] Field of Search .................................. 371/22.3, 22.5, 371/22.6, 22.1, 27

[56] References Cited

U.S. PATENT DOCUMENTS

| | | | |
|---|---|---|---|
| 5,056,094 | 10/1991 | Whetsel | 371/22.1 |
| 5,150,366 | 9/1992 | Bardell, Jr. et al. | 371/22.3 |
| 5,253,255 | 10/1993 | Carbine | 371/22.6 |
| 5,416,784 | 5/1995 | Johnson | 371/22.3 |
| 5,495,487 | 2/1996 | Whetsel, Jr. | 371/22.1 |

OTHER PUBLICATIONS

"IEEE Standard Test Access Port and Boundary–Scan Architecture", Circuits and Devices Communications Technology, IEEE Std 11.49.1–1990 (includes IEEE Std 1149.1A–1993), Oct. 21, 1993.

Primary Examiner—Robert W. Beausoliel, Jr.
Assistant Examiner—Trinh L. Tu
Attorney, Agent, or Firm—Knobbe, Martens, Olson & Bear, LLP

[57] ABSTRACT

A method for toggling the output pins of a IC chip to satisfy an ASIC manufacturer's output toggle test requirements parallel loads data from an IC tester into the IC's JTAG boundary scan data shift register, so that the parallel loaded data is an alternating high and low data bits. The test pattern of alternating data bits is then latched to the JTAG data latch register and driven onto the output pins of the IC chip. The bidirectional buffers connected to the output pins are then enabled for output while the IC tester tri-states its alternating data test pattern. The test pattern is then shifted by one bit within the IC's JTAG shift register and parallel loaded into the JTAG latch register on the next clock cycle. In this manner, the complement of a test pattern driven onto the output pins by the external test circuit is driven out from the IC chip. The process is then repeated once more to provide an alternating transition for each of the output pins so that a toggle from high to low and also from low to high is satisfied for each of the output pins on the IC chip.

6 Claims, 5 Drawing Sheets

I/O TOGGLE TEST METHOD USING JTAG

BACKGROUND OF THE INVENTION

1. Field of the Invention

The present invention relates to a method of satisfying an ASIC manufacturer's output toggle test requirements in an efficient, standardized manner which is not dependent on the specific primary functionality of that ASIC.

2. Description of the Related Art

A well-known method for testing complex integrated circuitry implemented within, for example, an integrated circuit (IC) chip, is the IEEE 1149.1 boundary-scan standard originated by the International Joint Test Action Group (JTAG), hereby incorporated by reference. One implementation of this standard involves designing components (e.g., integrated circuits) for serial boundary-scan testing by providing shift-register elements daisy chained to form a path around the periphery of an integrated circuit component.

The general concept for serial testing using JTAG is to shift serial data into and through a number of integrated circuit components to stimulate the circuitry therein or to generate predefined output signals from the circuitry. Thereafter, data generated by the integrated circuit components or received on inputs of the integrated circuit components are shifted from the integrated circuit components to a JTAG master testing circuit.

If the data stream returned to the master testing circuit is not as expected, then a malfunction in the circuit is detected by the testing circuit. A careful analysis under software control of the deviations in the data stream may isolate any malfunctions within a circuit.

Most application-specific integrated circuit (ASIC) vendors require that all output pins (i.e., output only pins as well as bidirectional (I/O) pins) of an IC under test be toggled within the first few hundred test vectors as part of the manufacturing test of an IC. That is, the IC testing circuit must observe a transition from a low voltage to a high voltage, as well as a transition from a high voltage to a low voltage at each output pin. This is to ensure that each of the outputs are operating properly and are capable of transitioning from state-to-state.

However, because many of the ICs tested could have complex state machine circuitry normally controlling the output pins to be toggled, complex analysis may be required to ensure that the appropriate test vectors are created cause each and every output pin to be toggled within the first few hundred test vectors. Toggling the outputs using the standard JTAG is not time-efficient for large pin count ICs since each new vector must be serially loaded through the JTAG interface. It is desirable to provide a standard method of toggling the outputs of an ASIC, or like IC, which does not depend upon the particular circuitry within the IC. Thus, a need exists for a simple and elegant method for insuring that each of the output pins on an IC is toggled.

SUMMARY OF THE INVENTION

A method for quickly and efficiently toggling each of the output pins under test on an IC requires adding a new JTAG "Toggle test" instruction to the IC, and changing all output-only pins to bidirectionals. The method comprises the steps of sending the new "Toggle test" instruction to the IC via the JTAG interface; placing the IC's I/O pins into a high impedance state; parallel loading a pattern of alternating high and low bits from the IC tester into each of the IC's JTAG boundary scan shift register elements via the IC's input pins; placing the I/O pins other than the JTAG control and data signals of the IC test circuit into a high impedance state; enabling the outputs of the IC's I/O pins with an alternating test pattern; recapturing the alternating test pattern being output by the IC, into the IC's BSR, (boundary scan register); shifting the alternating test pattern one bit position within the BSR; updating the data register (DR) with this new test pattern, causing all outputs to toggle a first time; recapturing this new (shifted) alternating test pattern output by the IC, into the IC's BSR; shifting the test pattern one bit position; and finally, updating the DR with a third alternating test pattern, causing all outputs to toggle a second time. Thus, each output will make a high-to-low transition and a low-to-high transition.

DETAILED DESCRIPTION OF THE INVENTION

Figure 1A:
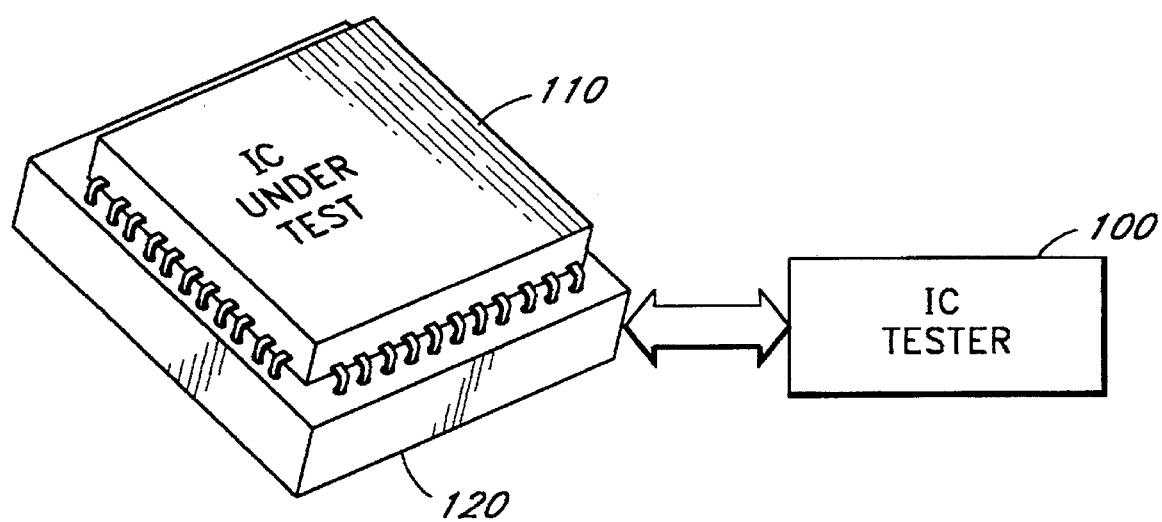
FIG. 1A is a perspective view of an IC chip under test using an IC tester.

FIG. 1A is a perspective view of an integrated circuit (IC) chip 110 under test using an IC tester 100. The IC chip 110 is plugged into a test socket 120. As shown in FIG. 1A, the IC chip 110 is packaged before testing. However, one of skill in the art will appreciate that the IC 110 could be tested on the fabrication wafer prior to packaging.

Figure 1B:
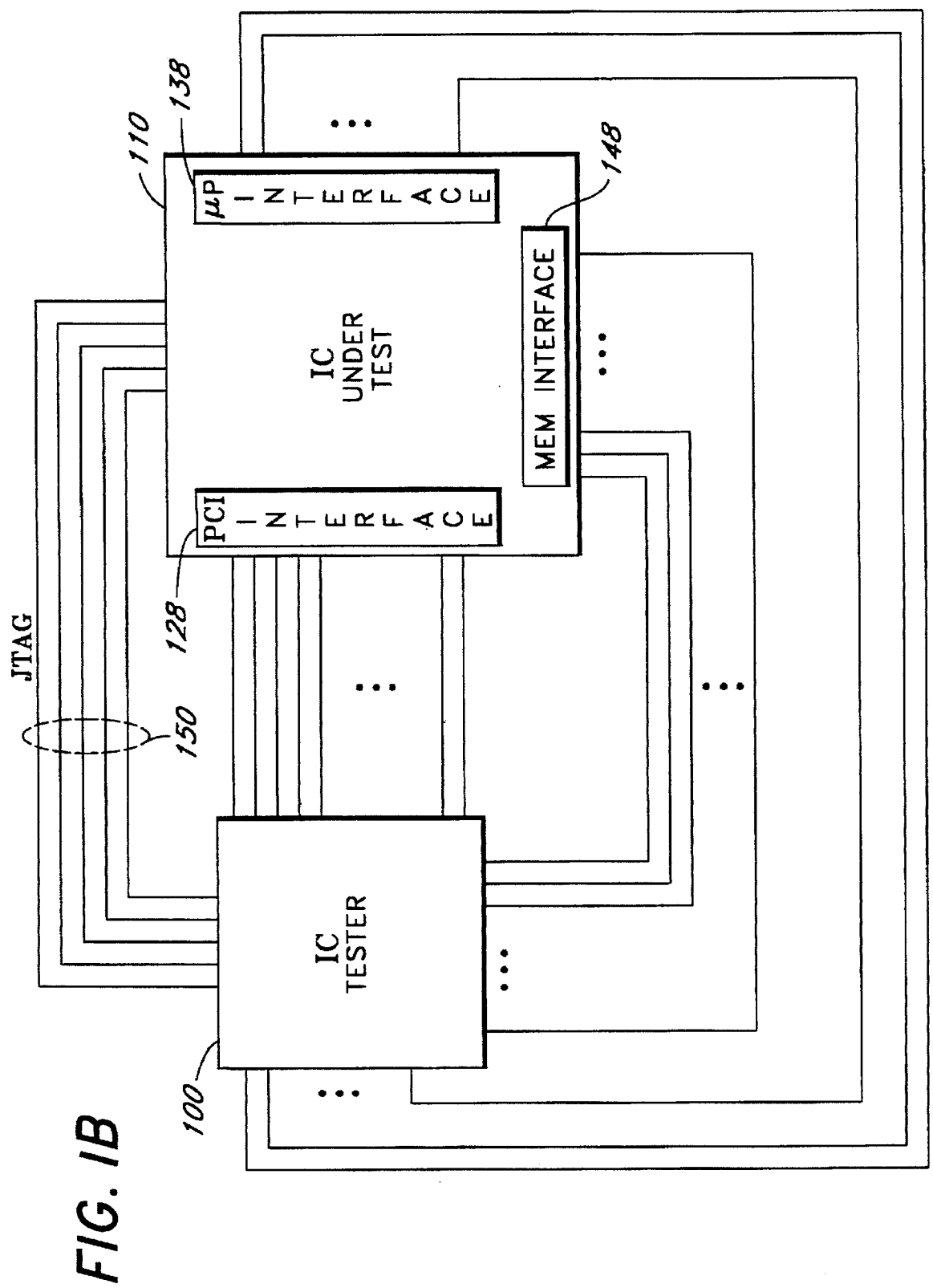
FIG. 1B is a schematic block diagram of the connection of the IC tester and IC of FIG. 1A.

FIG. 1B is a highly simplified schematic block diagram of the IC chip 110 as connected to the IC tester 100. As represented in FIG. 1B, the IC tester 100 connects to, for example, a PCI interface 128, a processor interface 138 and a memory interface 148 within the IC 110. JTAG lines 150 (including clock, serial data in, serial data out, and mode select signal lines) also connect the IC 110 with the IC tester 100. The PCI interface 128, processor interface 138 and memory interface 148 include a JTAG BSR (not shown in FIG. 1B) for testing the I/O pins of the IC 110.

In operation, the IC tester 100 loads predefined test vectors into the IC under test and compares the IC's outputs with expected results in order to determine if the IC 110 is operating properly, as is well understood in the art. If the IC 110 is not operating properly, then the IC 110 is identified as defective.

As briefly discussed above, most ASIC vendors require that all the output pins be toggled within the first few hundred test vectors. Thus, during testing of the IC chip 110, it will be necessary to ensure that all the I/O connections on the IC chip 110 are toggled. It is particularly advantageous to determine as soon as possible if all of the I/O connections can toggle. This is because a chip can be immediately marked as defective if one of the I/O connections does not toggle so that further testing of the IC 110 would not be necessary. Thus, valuable testing time is saved if the I/O connection toggle test can be performed within the first few test clock cycles.

Figure 2:
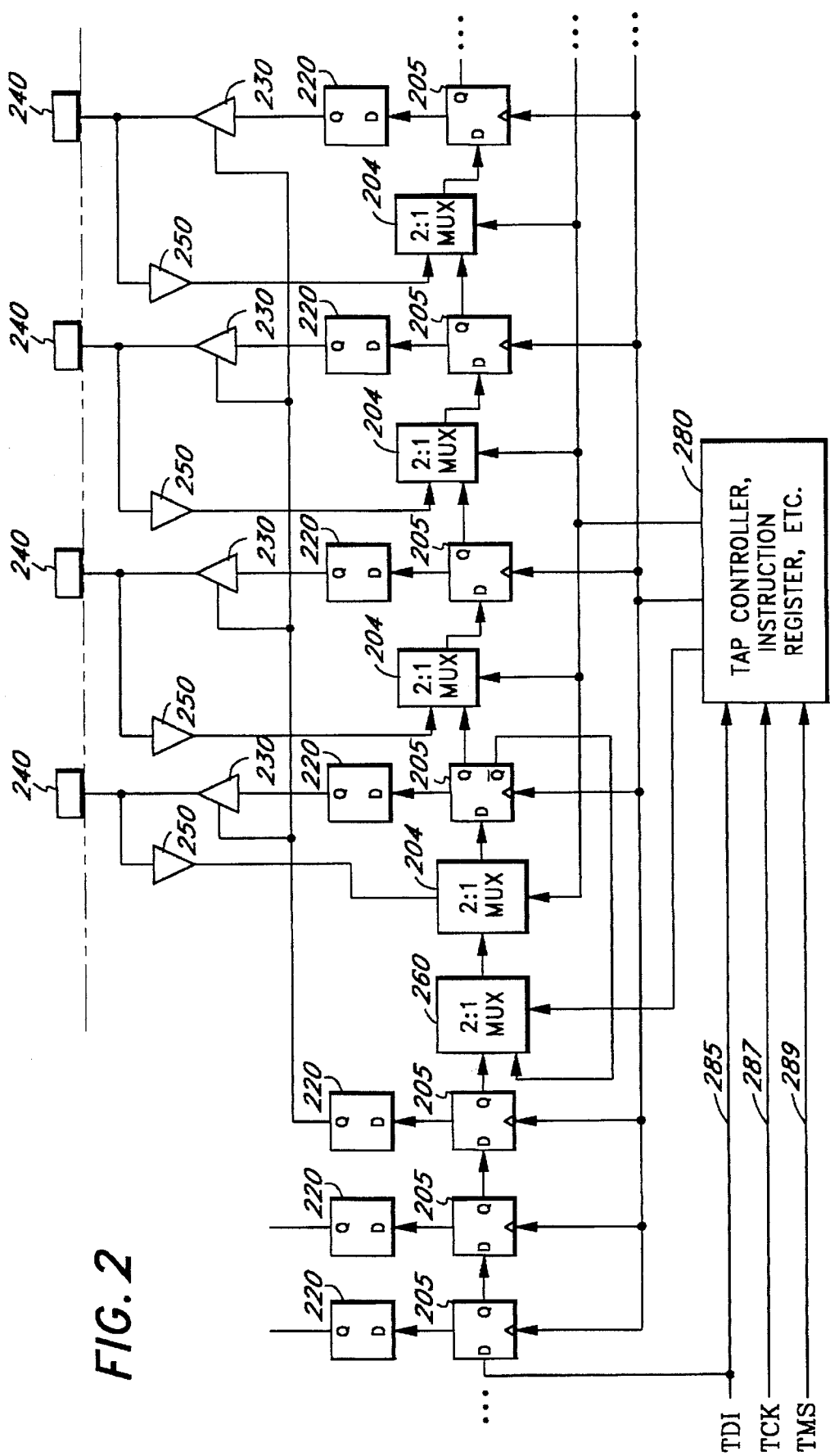
FIG. 2 is a schematic block diagram which illustrates a portion of the internal JTAG boundary scan test circuitry within the IC chip of FIG. 1.

FIG. 2 is a schematic block diagram which illustrates the JTAG BSR test circuitry internal to the IC chip 110 of FIG. 1. It will be appreciated by one of ordinary skill in the art, that the portion of the JTAG test circuitry 200 depicted in FIG. 2 is simplified for purposes of clarity and does not include, for example, the IC's core logic output multiplexer circuitry and output control circuitry which is typically associated with the JTAG boundary scan circuitry and which allows the IC to function normally when not under JTAG control. As shown in FIG. 2, a plurality of data shift register elements 205 (e.g., D-flip-flops) connect in series via a plurality of multiplexers 204 so that data bits stored in each of these shift register elements 205 may be shifted to the next shift register element upon the application of a clock pulse. Data may be latched from the outputs of the shift register elements 205 to the outputs of a plurality of latched data register elements 220 upon the application of an update trigger pulse so that the entire contents of the shift register are parallel loaded into the latched data register 220. When an output enable signal is active, output buffers 230 pass the signal present at the output of the latched data register elements 220 to a plurality of I/O pins 240 so that the data within the latched data register 220 may be used to drive outputs onto the I/O pins 240.

A plurality of input buffers 250 allow signals applied to the I/O pins 240 to be loaded into the shift register elements 205 via the multiplexers 204 when an enable signal is asserted. It should be noted here that the input buffers 250 also provide a connection between the I/O pins 240 and other circuitry within the IC chip; however, for purposes of clarity of illustration of the present invention, these connections are not shown in FIG. 2.

In a particularly preferred embodiment, special circuitry is provided within the JTAG boundary scan test register in order to facilitate the method of the present invention. Specifically, each of the shift register elements 205 which are used to store output enable bits are grouped together at one end of the boundary scan shift register, and a multiplexer circuit 260 is positioned between the shift register elements 205 which are used to store output enable bits and the shift register elements 205 which are used to store bits to be output over the I/O pins 240. When the multiplexer 260 is in a first select mode, the multiplexer 260 simply connects the output enable shift register elements 205 with the other shift register elements 205 in a normal manner so that test vector bits can be shifted through the boundary scan shift register without interruption. When the multiplexer 260 is in a second select mode (i.e., a toggle test mode), the inverted output of each shift register element 205 is connected to its respective input via multiplexers 260 and 204. As will be discussed in greater detail below, this configuration ensures that, when the JTAG test circuit is in the toggle test mode, the data bit shifted into the first shift register element 205 after the multiplexer 260 is the complement (i.e., opposite) of the bit shifted out of the first shift register element 205.

The shift register, elements 205, the latched register elements 220, and the multiplexers 260 and 204 are controlled by a JTAG TAP controller state machine, together with an instruction register and associated circuitry, generally designated by the reference numeral 280. Of course, it will be appreciated by those of ordinary skill in the art that the instruction register comprises separate loadable shift and latched registers that are used to control boundary scan test circuitry. The instruction register is included with the control circuitry 280 primarily as a matter of convenience for describing this aspect of the invention. The controller 280 receives instruction bits via a test data input (TDI) signal on line 285, a test clock signal (TCK) on a TCK line 287, and a test mode select (TMS) signal via a line 289.

Figure 3:
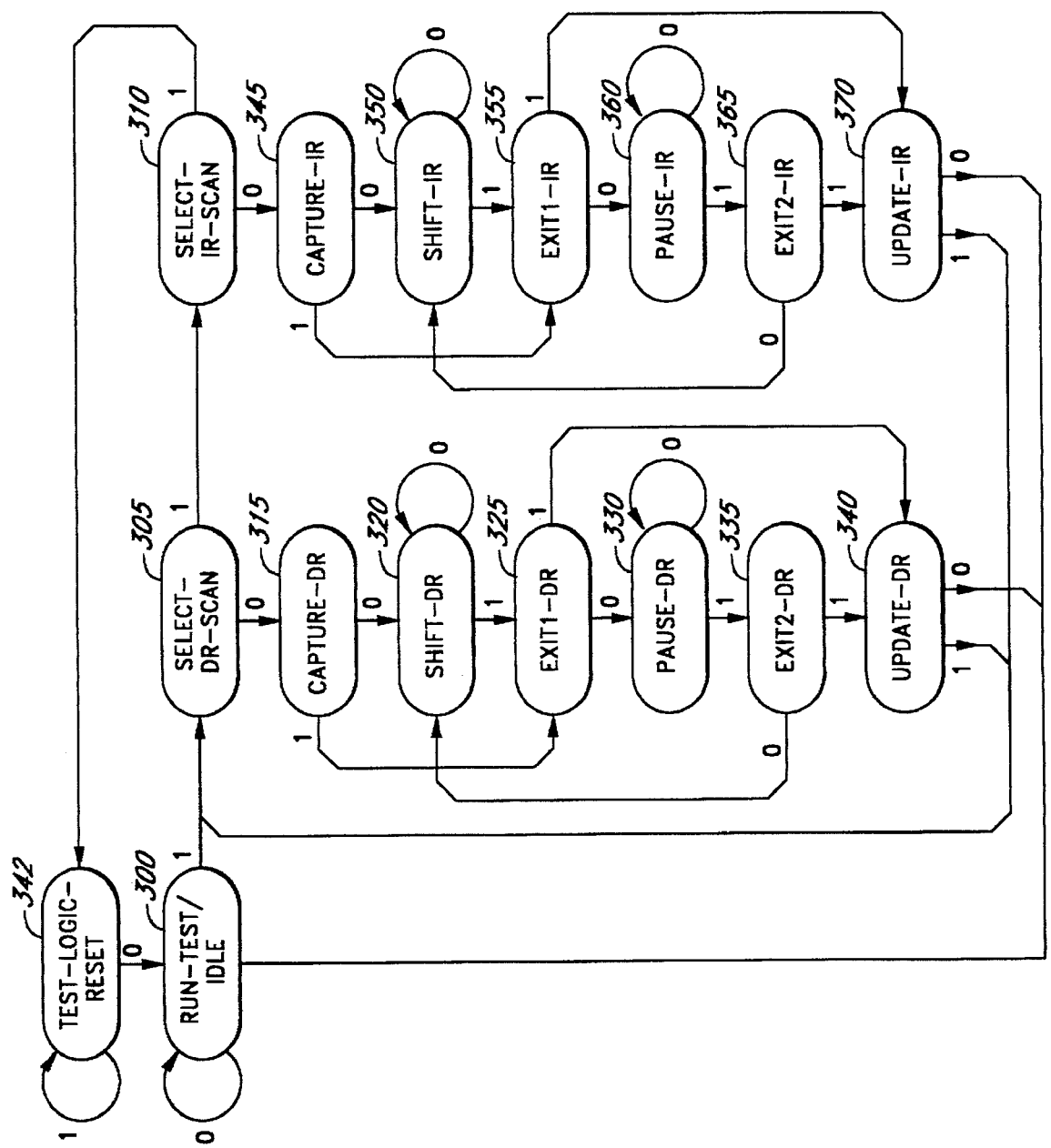
FIG. 3 is a state diagram showing the operation of the JTAG TAP controller circuit used to control the JTAG boundary scan test circuitry.

FIG. 3 is a state diagram which illustrates the operation of the TAP controller 280 in response to the TMS and TCK control signals provided on lines 289, 287. The TAP controller state machine 280 begins in the test logic reset state 342 and remains in that state while TMS=1. If TMS=0, the idle state 300 is entered. The idle state constitutes a controller state between scan operations. Once entered, the TAP controller 280 will remain in the idle state 300 as long as the TMS signal is held low. In the idle state 300, activity in selected test logic occurs only when certain JTAG instructions are present as is well understood in the art. For instructions loaded in the instruction register 280 that do not cause functions to execute in the idle TAP controller state 300, all test data registers selected by the current instruction shall retain their previous state.

When the TMS signal is high and a rising edge is applied to the TCK signal the TAP controller 280 moves to a select data register scan state 305. The select data register scan state 305 is a temporary controller state in which all test data registers selected by the current instruction retain their previous state. If the TMS signal is held low while a rising edge is applied to the TCK signal, then the TAP controller 280 transitions to a capture data register state 315, while if the TMS signal is held high, and a rising edge is applied to the TCK signal, then the TAP controller state machine 280 transitions to a select instruction register scan state 310.

If the TAP controller state machine 280 transitions into the capture data register state 315, then, in this state, data from input buffers 250 may be parallel-loaded into the shift data register 205 on the rising edge on the TCK signal. Furthermore, the bits stored within the instruction registers 280 remain unchanged while the TAP controller state machine 280 is in the capture data register state 315. When the TAP controller 280 is in the capture data register state 315 while TMS is held low and a rising edge is applied to the TCK signal, then the controller enters a shift data register state 320. However, if the TMS signal is held high while the rising edge is applied to the TCK signal, then the TAP controller state machine 280 transitions to an exit data register state 325 directly from the capture data register state 315. Within the shift data register state 320, data along the line 285 is shifted into the data shift register 205. Upon the application of each rising edge of the TCK signal while the TMS signal is held low, an additional bit of data is shifted into the data shift register 205 over the line 285. The TAP controller 280 continues in the shift data register state 320 as long as the TMS signal is held low. Thus, as many data bits as are necessary to load the prespecified test vectors into the shift registers 205 are shifted into the register 205 while the TMS signal is held low in the state 320.

When the TAP controller 280 is in the shift data register state 320 and a rising edge is applied to the TCK signal while the TMS signal is held high, then the TAP controller state machine 280 enters the exit data register state 325. The exit data register state 325 is a temporary controller state. If the TMS signal is held high, a rising edge applied to the TCK signal causes the TAP controller 280 to enter an update data register state 340, while if the TMS signal is held low while the rising edge is applied to the TCK signal then the TAP controller 280 enters a pause data register state 330. The pause data register state 330 allows the shifting of the test data register 205 to be temporarily halted. The TAP controller 280 remains in pause data register state 330 while the TMS signal is held low. When the TMS signal is held high and a rising edge is applied to the TCK signal, then the TAP controller state machine 280 enters an exit2 data register state 335 which is also a temporary controller state. If a rising edge is applied to the TCK signal while the TMS signal is held low, then the TAP controller state machine 280 returns to the shift data register state 320. However, if the TMS signal is held high while a rising edge is applied to the TCK signal, then the TAP controller state machine 280 transitions from the exit2 data register state 335 to the update data register state 340. As shown in FIG. 2, the shift data register 205 connects to a latched parallel output 220 to prevent changes to the data in the data register 205 while data is shifted in the associated shift register path 205 in response to certain instructions with the instruction register 280. Thus, in the update data register state 340, data is latched from the shift register 205 onto the parallel output of the shift register 220 on the falling edge of the TCK signal. Thus, this data is stored within the latched data register 220 so that the data within the register 220 does not change other than in the update data register state unless operation during the execution of a self-test is required (e.g., during the idle state in response to a design-specific JTAG instruction). As with each of the states 305–335, the instructions stored within the instruction shift register 280 and the instruction latch data register 280 do not change while the TAP controller 280 is within the update data register state 340. When the TAP controller is in the update data register state and a rising edge is applied to the TCK signal, the TAP controller 280 enters the select data register scan state 305 when the TMS signal is held high, or the idle state 300 when the TMS signal is held low.

If the TMS signal is held high, and a rising edge is applied to the TCK signal while the TAP controller state machine 280 is in the select data register state 305, then the TAP controller state machine 280 transitions to the select instruction register scan state 310.

If the TAP controller state machine 280 transitions into the capture instruction register state 345, then, in this state, instructions may be parallel-loaded into the instruction register 280 from the shift instruction register 280 on the rising edge of the TCK signal. Furthermore, the bits stored within the data registers 205, 220 remain unchanged while the TAP controller state machine 280 is in the captured instruction register state 345. When the TAP controller 280 is in the capture instruction register state 345 while the TMS signal is held low and a rising edge is applied to the TCK signal, then the controller enters a shift instruction register state 350. However, if the TMS signal is held high while the rising edge is applied to the TCK signal, then the TAP controller state machine 280 transitions to an exit instruction register state 355 directly from the capture instruction register state 345. Within the shift instruction register state 350, instructions along the line 285 are shifted into the instruction shift register 280. Upon the application of each rising edge of the TCK signal while the TMS signal is held low, an additional bit of instruction is shifted into the instruction shift register 280 over the line 285. The TAP controller 280 continues in the shift instruction register state 350 as long as the TMS signal is held low. Thus, as many instruction bits as are necessary to load the prespecified instruction vectors into the instruction shift registers 280 are shifted while the TMS signal is held low in the state 350.

When the TAP controller 280 is in the shift instruction register state 350 and a rising edge is applied to the TCK signal while the TMS signal is held high, then the TAP controller state machine 280 enters the exit instruction register state 355. The exit instruction register state 355 is a temporary controller state. If the TMS signal is held high, a rising edge applied to the TCK signal causes the TAP controller 280 to enter an update instruction register state 370, while if the TMS signal is held low while the rising edge is applied to the TCK signal then the TAP controller 280 enters a pause instruction register state 360.

The pause instruction register state 360 allows the shifting of the test instruction register 280 to be temporarily halted. The TAP controller 280 remains in pause instruction register state 360 while the TMS signal is held low. When the TMS signal is held high and a rising edge is applied to the TCK signal, then the TAP controller state machine 280 enters an exit2 instruction register state 365 which is also a temporary controller state. If a rising edge is applied to the TCK signal while the TMS signal is held low, then the TAP controller state machine 280 returns to the shift instruction register state 350. However, if the TMS signal is held high while a rising edge is applied to the TCK signal, then the TAP controller state machine 280 transitions from the exit2 instruction register state 365 to the update instruction register state 370. The shift instruction register 280 includes a latched parallel output to prevent changes to the instruction in the instruction register 280 while instruction bits are shifted into the instruction shift register. The instruction register latch 280 is only updated while in the update IR state 370. When the TAP controller 280 is in the update instruction register state 370 and a rising edge is applied to the TCK signal, the TAP controller 280 enters the select data register scan state 305 when the TMS signal is held high, or the idle state 300 when the TMS signal is held low.

If within the select instruction register state 310, the TMS signal is held high while a rising edge is applied to the TCK signal, the TAP controller 280 enters the test logic reset state 342. When the TAP controller state machine 280 enters the test logic reset state 342, the test logic is disabled so that normal operation of the on-chip system logic can continue unhindered.

Figure 4:
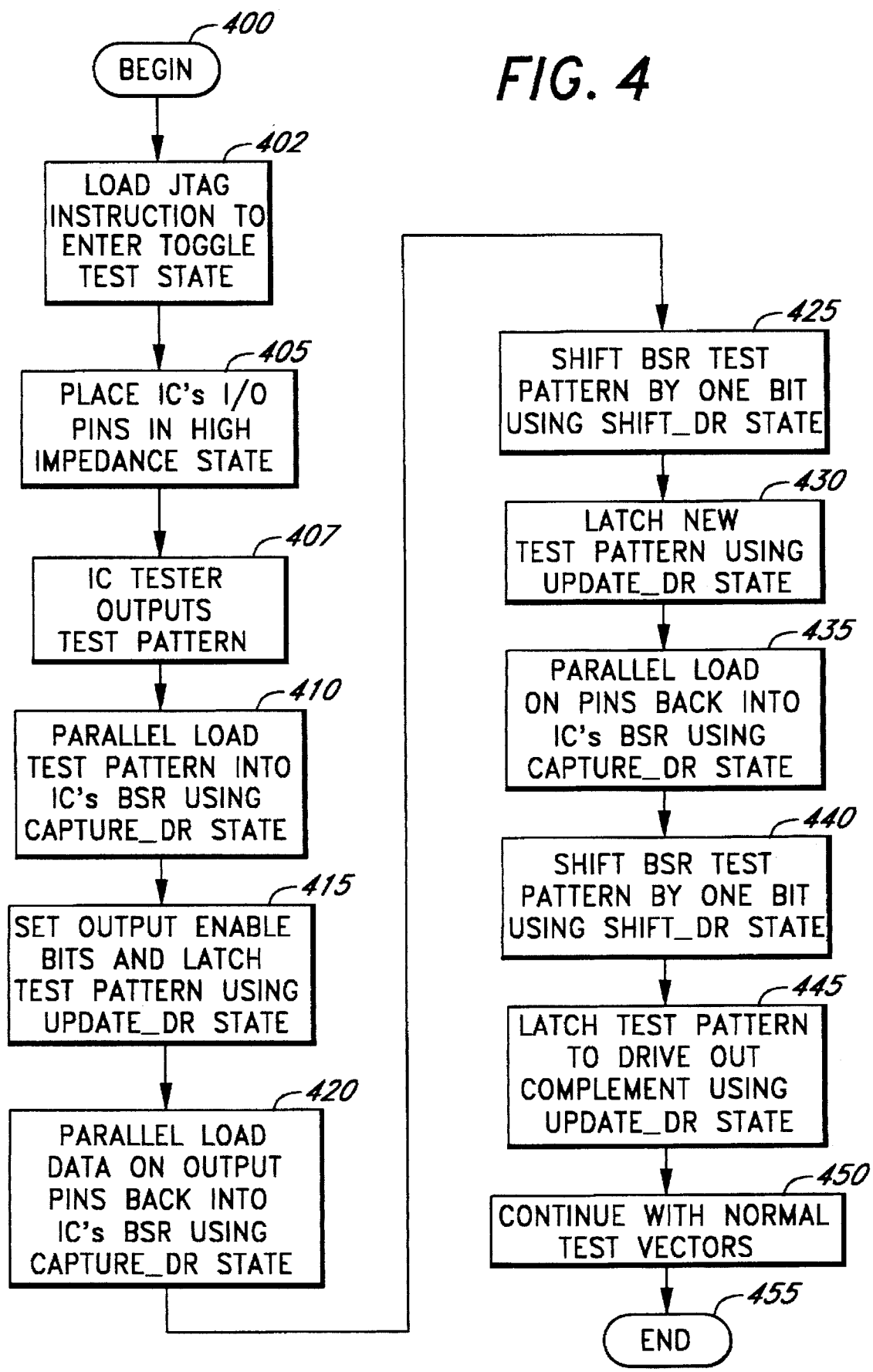
FIG. 4 is a flow chart which illustrates the general method used in accordance with the present invention to ensure that all of the I/O pins on the IC chip of FIGS. 1 and 2 are toggled within a few test vectors.

FIG. 4 is a flow chart which illustrates the method of the present invention for quickly and efficiently toggling the output pins of an IC chip. Once the method initiates as represented in a begin block 400, the instruction register (included in the controller 280) is loaded with the appropriate bits to set the JTAG boundary scan test circuit into the toggle test mode, as represented in an activity block 402. That is, the bits loaded into the instruction register are such that the select bit of the multiplexer 260 is set to cause an alternating bit pattern to be generated from its output. The output enable bits are subsequently set to place the I/O pins 240 in a high impedance state, as represented in an activity block 405. This is accomplished, for example, by shifting a sequence of 0's (i.e., low voltage level bits) into the data shift register elements 205 under the control of the controller 280 until all of the output enable bits have been cleared. After the output enable bits in the shift register elements 205 have been cleared, the update data register state is entered (see FIG. 3) so that the output enable bits stored in the shift register elements are latched to the corresponding latched data register elements 220. Consequently, the buffers 230 are tri-stated (i.e., placed in a high impedance state). As discussed above, the output enable bits are grouped together at one end of the data shift register so that all of the output enable bits can be set within a few clock cycles. Alternatively, special logic (not shown) can be provided which either parallel loads all of the output enable register elements or overrides the output enable register elements, regardless of their position within the register, to a desired bit value. Thus, in this alternative embodiment, a single operation can be used to enable all of the outputs to be toggled.

Next, the IC tester 100 outputs a test pattern onto the I/O pins 240, as represented in an activity block 407. Advantageously, the test pattern comprises alternating high and low bits (i.e., binary 1's and 0's) so that every element within the data shift register 205 is adjacent to its binary complement. The controller 280 then enters the capture data register state which causes the test pattern to be parallel loaded (i.e., scanned) into the data shift register elements 205, as represented in an activity block 410.

After the IC tester 100 has been placed in a high impedance mode, the output enable bits are subsequently set to enable output over the I/O pins 240, as represented in an activity block 415. This is accomplished, for example, by shifting a sequence of 1's (i.e., high voltage level bits) into the data shift register elements 205 under the control of the controller 280 until all of the output enable bits have been set. (As has been noted above, alternate logic can be used for this function.) After the output enable bits in the shift register elements 205 have been set, the update data register state is entered (see FIG. 3) so that the output enable bits stored in the shift register elements 205 are latched to the corresponding latched data register elements 220. As a result, the buffers 230 are enabled to output data present at the output of the latched data register elements 220.

The test pattern of alternating high and low bits is latched into the latched data register at the same time that the output enable bits are latched to the latched data register (i.e., under the control of the same update instruction). Thus, the test pattern is driven out onto the I/O pins 240 since the outputs of the latch data register elements 220 are connected to the I/O pins 240 via the enabled buffers 230.

Once the test pattern of alternating high and low bits has been driven out onto the I/O pins 240 of the IC chip 110, this data pattern is sampled so as to be parallel loaded into the data shift register elements 205, as represented in an activity block 420. The sampling of the bits present on the I/O pins 240 is accomplished by placing the controller 280 in the capture data register state 315. Thus, the data shift register stores the exact same test pattern as was originally stored prior to driving the test pattern out onto the I/O pins 240.

The shift-DR state 320 then causes the test pattern stored within the data shift register elements 205 to shift by one bit as represented within an activity block 425. Thus, each of the data shift register elements 205 will store the complement of the bit stored in the previous clock cycle (i.e., before the shift has occurred). Because the multiplexer 260 is set to the toggle test mode so that the output of the first shift register element is inverted and loaded back into the first shift register element, each time a shift is performed the pattern of alternating high and low bits is preserved.

Once the test pattern has been shifted by one bit, this shifted test pattern is latched into the latched data register elements 220 via the update state 340, as represented in an activity block 430. Thus, the complement of the original test pattern which was driven out onto the output pins 240 is now driven out so that the output pins 240 are caused to toggle from either the low state to the high state or, alternately, from the high state to the low state. In this manner, the first half of the toggle requirements are satisfied.

To satisfy the second half of the toggle requirements (i.e., to toggle on the complementary direction so that if the first toggle was from a low state to a high state, the second toggle is from a high state to a low state and vice versa), the data on the output pins 240 are loaded back into the data shift register 205 by means of a capture-DR state 315 as represented in an activity block 435. Once this test pattern has been loaded into the data shift register elements 205, the test pattern is shifted by one bit as represented in an activity block 440. Subsequently this shifted test pattern is latched to the latched data register elements 220, as represented in an activity block 445, so that the complement of the data which is presently on the I/O pins 240 is driven out onto the pins 240.

In this manner, the second half of the toggle requirements is satisfied so that there is no further necessity to ensure that the remaining test vectors be specially tailored to ensure a toggle for all the I/O pins 240. Thus, as represented in an activity block 450, the JTAG circuitry is disabled by transitioning the TAP controller state machine 280 to the Test-logic reset state 342. Normal mode testing of the IC can now be performed by the IC tester 100. The method is then terminated as indicated within an end block 455.

Although the present invention has been described in detail above, it should be understood that the foregoing description is illustrative and not restrictive. Those of ordinary skill in the art will appreciate that many obvious modifications can be made to the invention without departing from its spirit or essential characteristics. For example, the output enable bits may be controlled by a variety of different methods, such as parallel loading or serial shifting of the desired bit values. Furthermore, the multiplexer circuit 260 need not be implemented to ensure that the alternating test pattern is preserved. In practice, other specialized circuitry could be used to perform the same function as called for by the specific application. Accordingly, the scope of the invention should be interpreted in light of the following appended claims.

What is claimed is:

1. A method for quickly and efficiently toggling output pins under test on an integrated circuit, wherein each of said output pins is coupled to a corresponding boundary scan latch, and each of said boundary scan latches is coupled to a corresponding boundary scan shift register element, and wherein said output pins are further in electrical communication with a test circuit, said method comprising the steps of:

parallel loading, via said output pins, a first test vector from the test circuit into said boundary scan shift register elements as a first test pattern;

placing said test circuit in a high impedance state;

driving said first test pattern onto said output pins from said boundary scan latches in response to said first test vector;

parallel loading said first test pattern into said boundary scan shift register elements from said output pins;

driving a second test pattern onto said output pins from said boundary scan latches, wherein said second test pattern is the complement of said first test pattern;

parallel loading said second test pattern into said boundary scan shift register elements from said output pins; and driving a third test pattern onto said output pins from said boundary scan latches, wherein said third test pattern is the complement of said second test pattern.

2. A method as defined in claim 1, wherein said test circuit comprises an IC tester.

3. A method as defined in claim 1, wherein said first test pattern is shifted within said boundary scan shift register elements after parallel loading said first test pattern into said boundary scan shift register elements to produce said second test pattern.

4. A method as defined in claim 1, wherein said second test pattern is shifted within said boundary scan shift register elements after parallel loading said second test pattern into said boundary scan shift register elements to produce said third test pattern.

5. A method as defined in claim 1, wherein the test circuit drives a complement test pattern after loading said first test vector into said boundary scan shift register elements before being placed in said high impedance state.

6. An apparatus for quickly and efficiently toggling output pins under test on an integrated circuit, wherein each of said output pins electrically connects to a corresponding boundary scan latch, and each of said boundary scan latches electrically connects to a corresponding boundary scan shift register element, and wherein said output pins are further in electrical communication with a test circuit, said apparatus comprising:

a boundary scan shift register comprising a plurality of said boundary scan shift register elements connected in a daisy-chain configuration to enable data to be shifted from one element to a next adjacent element, said boundary scan shift register receiving a parallel loaded test pattern from said output pins, said parallel loaded test pattern comprising alternating logical ones and logical zeroes; and a multiplexer situated at an end of said boundary scan shift register, wherein said multiplexer has a first input in communication with an internal test data input (TDI) line, and a second input in communication with an inverted output of a first boundary scan shift register element of said boundary scan shift register, said output of said multiplexer in communication with an input of said first boundary scan shift register element, wherein said multiplexer causes said inverted output of said first boundary scan shift register element to be input to said input of said first boundary scan shift register element when said multiplexer is in a toggle test mode, and wherein said parallel loaded test pattern in said elements of said boundary scan shift register is logically shifted by one element after loading said parallel loaded test pattern of alternating logical ones and logical zeroes, thereby forming a pattern complementary to said parallel loaded test pattern in said boundary scan shift register.

\* \* \* \* \*